United States Patent
Blystone

(10) Patent No.: US 6,785,516 B1
(45) Date of Patent: Aug. 31, 2004

(54) TESTING DEVICE FOR WIRELESS TRANSMISSION TOWERS

(76) Inventor: John Blystone, 1848 Celeste Cir., Austintown, OH (US) 44511

(*) Notice: Subject to any disclaimer, the term of this patent is extended or adjusted under 35 U.S.C. 154(b) by 421 days.

(21) Appl. No.: 10/057,588

(22) Filed: Jan. 24, 2002

(51) Int. Cl.$^7$ .............................................. H04B 17/00
(52) U.S. Cl. ............................ 455/67.14; 455/67.11; 455/115.1; 455/115.2; 455/226.1; 375/224; 370/251; 324/533
(58) Field of Search ........................ 455/67.11, 67.12, 455/67.13, 67.14, 67.15, 63.1, 67.7, 115.1, 115.2, 115.3, 115.4, 226.1, 226.2, 226.4, 227, 423, 424, 282; 375/224; 370/248, 249, 251, 242; 324/126, 127, 500, 537, 531, 533

(56) References Cited

U.S. PATENT DOCUMENTS

| | | | | |
|---|---|---|---|---|
| 3,755,732 A | * | 8/1973 | Couper | 324/645 |
| 4,630,228 A | * | 12/1986 | Tarczy-Hornoch et al. | 702/59 |
| 6,005,518 A | * | 12/1999 | Kallina | 342/459 |

* cited by examiner

*Primary Examiner*—Lee Nguyen
*Assistant Examiner*—Minh Dao
(74) *Attorney, Agent, or Firm*—Harpman & Harpman

(57) ABSTRACT

A test device to isolate and locate problems in a wireless transmission antenna system by selectively inducing multiple faults in an independent integral configuration. The test device is used in conjunction with test analysis equipment allowing a technician to induce independent multiple faults system test configurations to detect, isolate and locate feed line and antenna system problems. By selectively connecting the test device at different points along the transmission path dependent on the test analysis outcome, the exact physical location of the problem can be determined within the transmission circuit.

14 Claims, 4 Drawing Sheets

TESTING DEVICE FOR WIRELESS TRANSMISSION TOWERS

BACKGROUND OF THE INVENTION

1. Technical Field

This invention relates to the use of transmission line testing equipment used for the site testing of wireless transmission systems at the tower site. A variety of transmission line problems can occur at the transmission tower site which can create, for example, wireless phone users symptoms such as poor receiver signals and increase drop out call rates. Such problems can occur in a variety of situations such a rainwater penetration, condensation, and bullet holes, for example. Also improper installation situations such as feed line clamps being over tightened or for example, crimped or smashed cable and improper or loose connections during installation, etc.

Determining the nature and most importantly the location of the problem along the transmission line is critical to the proper repair and replacement of the affected element in the field.

2. Description of Prior Art

Prior art testing analysis devices have been developed to test transmission lines and analyze antennas used in the cellular telephone industry. Typically, such testing devices will determine the nature of the problem and attempt to isolate and thus indicate the location of the problem within the system. Such testing equipment utilizes a variety of specific testing procedures such as frequency domain reflectometer (FDR) to cover the required frequencies or range of frequencies. Time domain reflectomoter (TDR) test instrument uses a pulse which is able to detect system faults that may lead to a system failure. Other tests will perform a variety of RF measurements such as return loss and SWR measurements, well known and understood by those within the art.

Such test as return loss, cable loss and distant to fault can be performed by such testing equipment. Specific samples of testing equipment are manufactured by Anritsu under the brand name such as Site Master, Model Series 51134 and 5331-2C. It is important to note that with the use of the existing testing equipment, it is very difficult to determine the exact physical location of the problem in the transmission line given that often the actual feed line length is not known to the technician at the location. Present testing equipment may indicate a problem at some point along the feed line and antenna, but often does not relate physically where that problem i.e. fault is actually located.

SUMMARY OF THE INVENTION

A multi-feature testing device for use on wireless transmission towers that can induce a number of testing criteria or faults to the cell tower transmission circuit. The device has multiple testing features including an open short, a short induced by grounding and interchangeable loads and connectors. The induced loads can be selectively changed by the use of interchangeable load circuits, well known and available within the art. An interchangeable connector is provided to accommodate a variety of connector configurations encountered in the field. The testing device allows a technician to easily perform multiple fault location tests at selective locations on the tower to isolate the fault area so that associated testing equipment can determine the nature and the exact location of the problem within the section isolated.

DESCRIPTION OF THE INVENTION

DESCRIPTION OF THE PREFERRED EMBODIMENT

Figure 1:
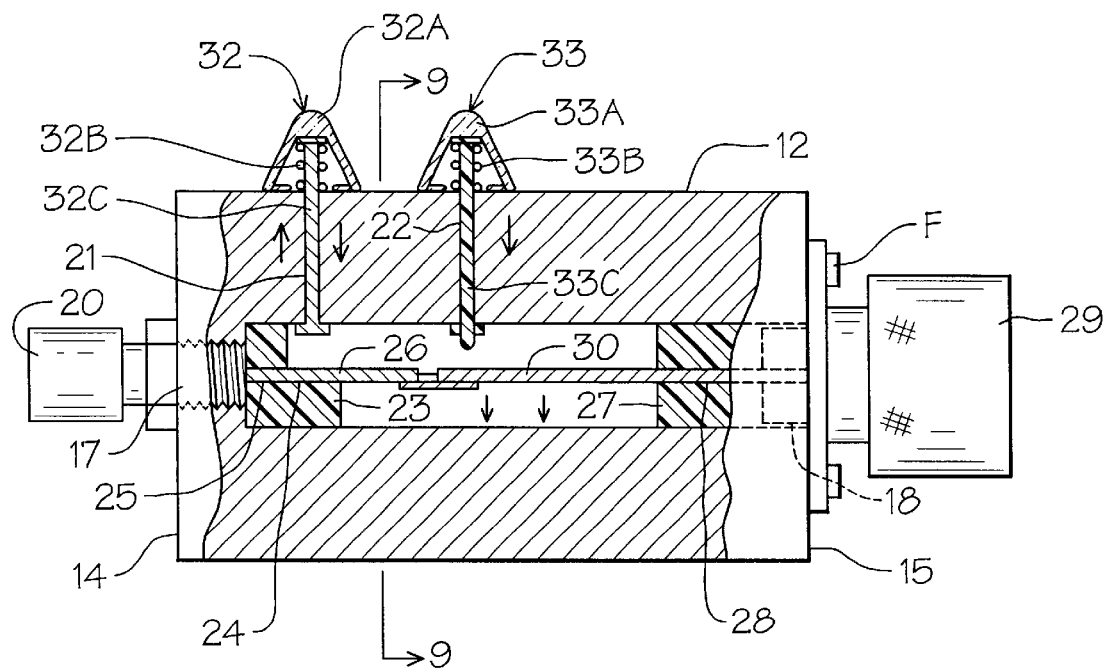
FIG. 1 is a partial cross-sectional view of the testing device of the invention.

Referring now to FIG. 1 of the drawings, a testing device 10 of the invention can be seen having a generally rectangular main housing 11 with a top 12, bottom 13 and oppositely disposed ends 14 and 15. A mounting bore at 16 extends longitudinally through the main housing 11 defining oppositely disposed access openings 17 and 18 in the respective ends 14 and 15. The access opening 17 is internally threaded at 19 to accept a load inducer element 20 therein as will be disclosed in greater detail hereinafter.

A pair of spaced parallel vertically oriented activation openings 21 and 22 extend from the top surface 12 and are in communication with the mounting bore 16. A first annular insulator mount 23 is positioned within the bore 16 abutting the threaded portion 19. The insulator mount 23 has a notched portion at 24 with a central aperture 25 extending therethrough to receive and support a first conductive pin 26 extending from the load inducer 20.

The load inducer 20 is available in different wattages to simulated loads such as 50 ohm and has the conductive pin 26 used for the testing device 10 of the invention attached thereto. A second annular insulator mount 27 is positioned within the mounting bore 16 inwardly of the opposite access opening 18 in the end 15 of the main housing 11 as hereinbefore described. The second insulator mount 27 is centrally apertured at 28.

A connector fitting 29 is mounted within the opening 18 in the end 15 of the main housing 11 by fasteners F and in this example chosen for illustration is a type N male as will be understood by those skilled in the art.

A second conductive pin 30 is attached to and extends from the conductor fitting 29 through the aperture 28 in the second insulator mount 27 having a contact 31 attached to and extending from its free end in spaced relation to the insulator mount 27.

Figure 2:
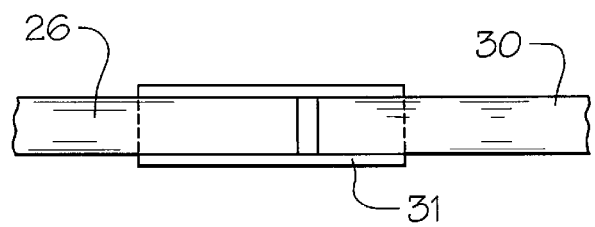
FIG. 2 is an enlarged top plan view of a contact engagement portion of the testing device.
Figure 3:
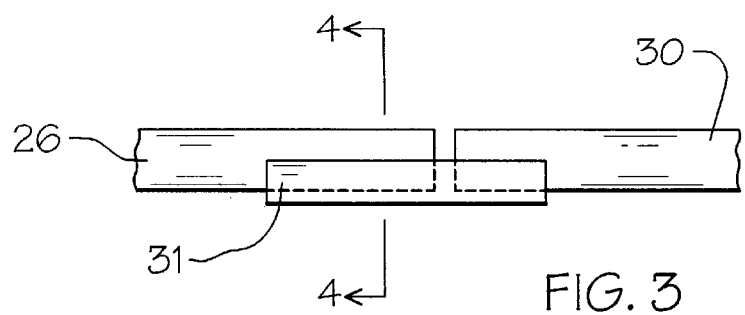
FIG. 3 is an enlarged side elevational view of the contact engagement portion shown in FIG. 2.
Figure 4:
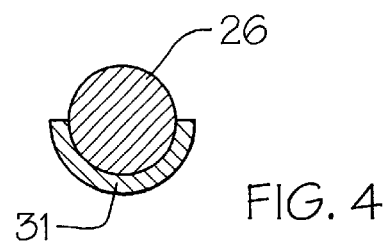
FIG. 4 is an enlarged cross-sectional view on lines 4—4 of FIG. 3.

The contact 31 is contoured for partial surface attachment with the conductive pin 30 and selective engagement with the first conductive pin 26 as best seen in FIGS. 2, 3 and 4 of the drawings.

It will be evident to one skilled in the art that the conductive pins 26 and 30 and the contact 31 must be of a highly conductive nature and therefore would be preferable plated with gold as is the standard within the industry.

A pair of test activation fault assemblies 32 and 33 are positioned from the top 12 of the main housing 11 having respective rubber weather engagement caps 32A and 33A and associated springs 32B and 33B as will be described in greater detail hereinafter.

Figure 5:
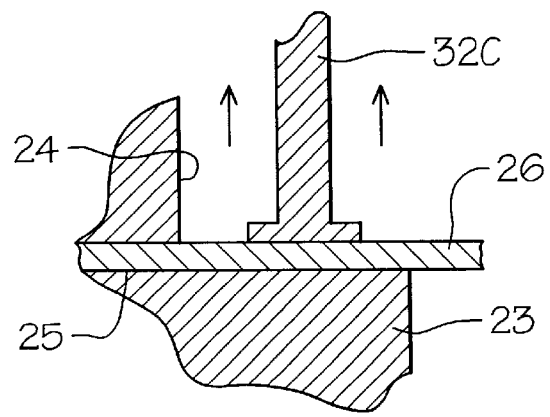
FIG. 5 is an enlarged partial cross-sectional view of the ground inducing short activation elements.

The fault activation assembly 32 has a conductive activation rod 32C extending through the access opening 21 for selective engagement with the first conductive pin 26 in the notched end portion 24 of the insulator 23, best seen in FIGS. 1 and 5 of the drawings. The fault activation assembly 33 has a non-conductive activation rod 33C, preferably plated with gold, extending through the respective access opening 22 for selective engagement with the second conductive pin 30 which is in communication with the first conductive pin 26 via the contact 31 as hereinbefore described. It will be evident from the above description that both the respective activation rods 32C and 33C are held in non-activation position by engagement of their respective springs 32B and 33B thereon within the respective weather caps 32A and 33A.

Figure 7:
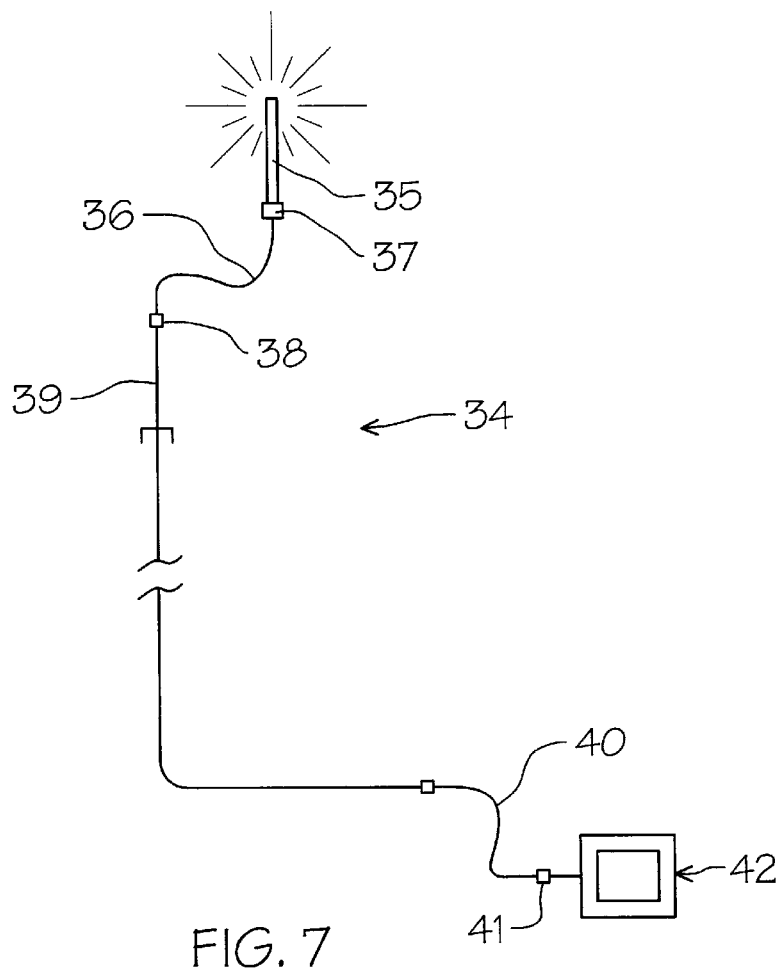
FIG. 7 is a graphic representation of a cellular antenna tower installation illustrating placement of test equipment and the testing device.
Figure 8:
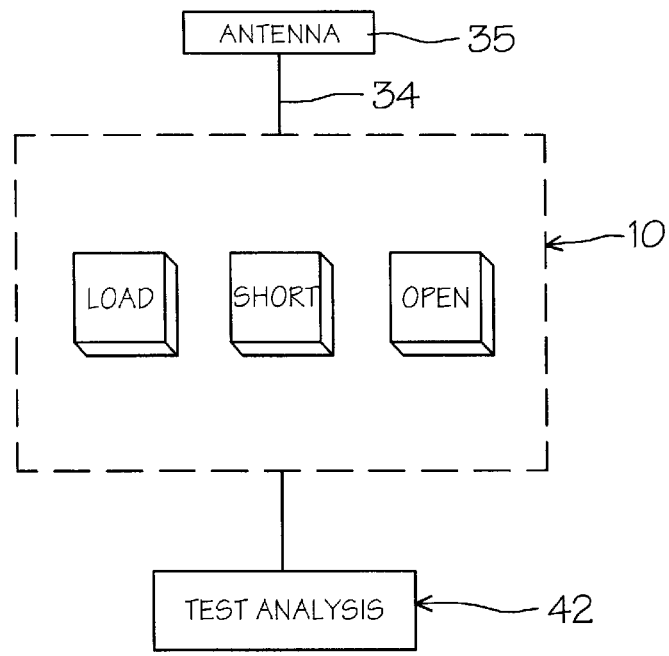
FIG. 8 is a block flow diagram of the induced testing elements by the testing device within the antenna circuit.
Figure 9:
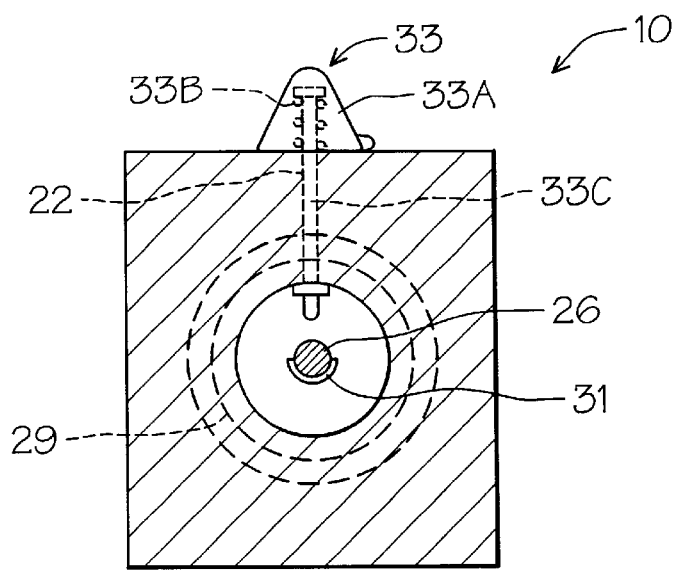
FIG. 9 is a cross-section on lines 9—9 of FIG. 1.

Referring to FIG. 7 of the drawings, an illustrative wireless transmission circuit 34 is shown having an antenna 35 with an antenna jumper 36 connected by a top connector 37 and bottom connector 38 to a feed line 39. Correspondingly, at the opposite end of the feed line 39 a feed line jumper 40 has a bottom connector 41 for connection with the associated test analysis equipment generally indicated at 42.

This type of testing analysis equipment 42 is typically referred to as transmission line and antenna analyzer devices which are currently used within the industry to detect and locate fault problems within the antenna system.

In use, the testing device 10 of the invention is used in conjunction with the testing equipment 42 which will allow an onsite technician (not shown) to easily pinpoint the fault problem.

The type of test analysis equipment 42 used is a FDR (Frequency Domain Reflectometer) an example of which is manufactured by Anrtisu, model no. 331 B. A TDR (Time Domain Reflectomotor) an example manufactured by Bird, model no. 2500A and a network analyzer example, manufactured by Marconi, no. 6200A or similar such devices.

The testing device 10 of the invention uses its load inducer 20 to simulate the antenna system being tested in a new condition. Once the testing device 10 is connected into the transmission system, a "short" can be induced by use of the first fault activation assembly 32 by depressing the weather guard 32A and advancing the conductive rod 32B against the spring 33B into contact with the conductive pin 26 extending from the load inducer 20. The conductive pin 26 effectively shorts the conductive rod 32B with the housing 11 which will validate the position of the testing device 10 in the circuit by using the test equipment "distance to fault" mode as hereinbefore described.

Figure 6:
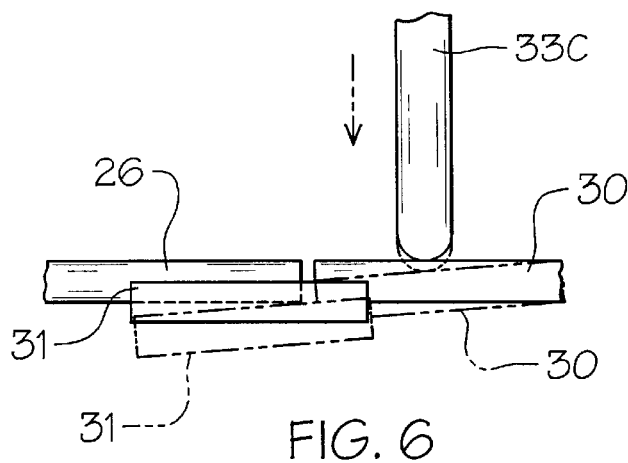
FIG. 6 is an enlarged partial side elevational view of the open induced short activation elements.

Alternately, by depressing the second fault activation assembly 33 the non-conductive rod 33B will be advanced against the spring 33B engaging the second conductive pin 30 displacing it by deflection so as to displace the contact 31 with the conductive pin 26 as best seen in FIG. 6 of the drawings. This imparts a "open short" defining a "open circuit" which also confirms the physical location of the tester 10 within the system and serves to isolate the open end of the feed line 39 from the inner band RF test signal which will disrupt the readings on the test equipment.

The following test procedure is used when the test analysis equipment 42 indicates initially that the problem i.e. fault is off the ground. In this situation, the testing device 10 of the invention is installed first on the upper jumper connection 37 illustrated in FIG. 7 of the drawings. If the fault is no longer present as indicated by the test analysis equipment 42, the problem is then determined to be within the antenna 35 and can be replaced.

If the problem i.e. fault is still indicated, the user will activate the testing device 10 "sending" a short which will identify on the test analysis equipment 42 the testing device 10 location and is appropriately noted. The test analysis equipment 42 will then determine (by use of distant to fault feature) how far the problem i.e. fault is from the tester 10 and record same by placement of a marker in the test analysis equipment indicating where the fault is. Accordingly the difference of the distance from the marker to the test device 10 becomes the actual distance to the problem i.e. fault. This distance is then physically measured on the tower from the test device 10 which will provide an actual physical location of the problem i.e. fault in the transmission line.

In an example in which the fault measurement is at the feed line connector then it will be necessary to open up this connection and connect the testing device 10 to the feed line 39. Accordingly, if the problem is no longer present, then it can be determined that the problem is in the antenna jumper 36.

If the problem still exist and the technician determines the fault lies just below the testing device 10, the fault may be in the top feed line connector 38, for example. After repairs are made, a final confirmation test is performed by the test analysis equipment 42 to confirm proper operation of the antenna system.

It will be evident from the above description that the testing device 10 of the invention provides for a simple compact mobile device that can easily be used by a technician on a wireless transmission tower to determine the exact location of a fault within the antenna transmission system working in conjunction with currently available testing analysis equipment 42 operated by a technician on the ground. The testing device 10 of the invention provides for isolation of sections of the antenna transmission system and can be identified within the transmission line accurately by inducing an open short or a ground short which is then used to determine in conjunction with the distance to fault indicator of the test analysis equipment 42, the actual physical distance from the testing device 10 to the problem i.e. fault within the antenna system.

It will thus be seen that a new and useful testing device has been illustrated and described and it will be apparent to those skilled in the art that various changes and modifications may be made therein within departing from the spirit of the invention.

Therefore I claim:

1. In a wireless transmission system having a transmission line, an antenna and interconnecting lines, a test instrument to induce transmission line indicators for locating existing problems in the transmission system comprises, a central housing having an aligned connection portals, an interchangeable connector registerably engaged within one of said portals, a load inducer fitting in said remaining portal, conductor elements extending from said respective connector and fittings, insulation means isolating said conductor elements from said housing, means for grounding said conductor elements within said housing, means for opening said conductor element by displacement of one of said conductor elements and means for selectively interconnecting said respective switch elements.

2. The test instrument set forth in claim 1 wherein said means for grounding said conductor element with said housing comprises a conductive rod movable from a first position within said housing to a second position against said conductor element.

3. The testing device set forth in claim 1 wherein said conductor elements are independent conductive pins in spaced end-to-end relation.

4. The testing instrument set forth in claim 1 wherein said means for opening said conductor element by deflecting one of said conductor elements comprises, a non-conductive rod movable from a first position within said housing to a second position engageable against said movable portion of said conductor element.

5. The testing instrument set forth in claim 1 wherein said means for selectively interconnecting said respective conductor elements comprises, a contact extending from one of said conductor elements and selectively engaging said remaining conductor element.

6. The testing instrument set forth in claim 2 wherein said conductive rod has a spring engageable thereon and a resilient cover about said spring and a portion of said rod extending from said housing.

7. The test instrument set forth in claim 2 wherein said non-conductive rod has a spring engageable thereon and a resilient cover about said spring and a portion of said rod extending from said housing.

8. The test device set forth in claim 4 wherein said contact extending from one of said conductor elements is of a contoured channel configuration.

9. A test instrument for use with electronic transmission line testing equipment to induce electrical faults within a wireless transmission tower line to isolate and locate transmission line and antenna problems comprises the steps of a. connecting test device to a deactivated antenna transmission line circuit
   b. determining if a problem is indicated within that transmission line circuit
   c. determining if the problem is at ground level or off the ground on the transmission tower
   d. positioning said test device at the end of an antenna jumper
   e. identifying if problem is still present
   f. sending a short via testing device to identify the position of the testing device on the test equipment if problem is still present
   g. determining distance of the problem from testing device by indicating fault position indicated on testing equipment
   h. subtracting distance read on test equipment from fault indicator on test equipment
   i. physically measuring from test instrument along transmission line the distance to the fault
   j. defining exact physical location of the fault.

10. The method step for using the test device with the testing equipment set forth in claim 9 wherein said testing equipment can comprise a FDR (Frequency Domain Reflectometer), a TDR (Time Domain Reflectomoter) and a network analyzer.

11. The method step set forth for using a test device with said testing equipment in claim 9 wherein said testing device comprises, a central housing having a load inducer and a connector fitting, contact switching elements extending from said respective load inducer and connector fitting, means for inducing a grounded short between said housing and said load inducer conductor, means for inducing an open short between said load inducer and said conductor fitting.

12. The method step for using the test device with testing equipment in claim 11 wherein said contact switching elements comprises a first conductor pin extending from said load inducer and a second conductor pin extending from said connector fitting, a contact element extending from said second conductor pin.

13. The method steps for using the test device with testing equipment set forth in claim 11 wherein said means for inducing a grounded short between said housing and said load inducer conductor comprises, a conductive rod selectively advanced from within an aperture in said housing engageable on one of said contact switching elements.

14. The method steps for using the test device with testing equipment set forth in claim 11 wherein said means for inducing an open short between said load inducer and said connector fitting comprises, a non-conductive rod selectively advanced from within said housing to engage one of said contact switching elements deflecting same from communication with said contact switching elements on said load inducer.

* * * * *